United States Patent
Lee et al.

(10) Patent No.: US 8,455,945 B2
(45) Date of Patent: Jun. 4, 2013

(54) SEMICONDUCTOR DEVICE HAVING SADDLE FIN TRANSISTOR AND METHOD FOR FABRICATING THE SAME

(75) Inventors: Jin Yul Lee, Icheon-si (KR); Dong Seok Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 543 days.

(21) Appl. No.: 12/494,567

(22) Filed: Jun. 30, 2009

(65) Prior Publication Data
US 2010/0163976 A1  Jul. 1, 2010

(30) Foreign Application Priority Data
Dec. 26, 2008  (KR) .................. 10-2008-0134817

(51) Int. Cl.
*H01L 29/66* (2006.01)
(52) U.S. Cl.
USPC ............... 257/331; 257/300; 257/E21.429
(58) Field of Classification Search
USPC ........................... 257/331, E21.429
See application file for complete search history.

(56) References Cited

U.S. PATENT DOCUMENTS

| 6,855,989 B1 | 2/2005 | Wang et al. |
| 2005/0255643 A1 | 11/2005 | Ahn et al. |
| 2006/0097314 A1* | 5/2006 | Uchiyama ............... 257/330 |
| 2008/0191288 A1* | 8/2008 | Kwon et al. ............. 257/383 |

FOREIGN PATENT DOCUMENTS
KR  10-2008-0000833  1/2008
KR  10-2008-0041439  5/2008

* cited by examiner

*Primary Examiner* — Thao Le
*Assistant Examiner* — Allen Parker
(74) *Attorney, Agent, or Firm* — Marshall, Gerstein & Borun LLP

(57) ABSTRACT

A method for fabricating a semiconductor device includes forming a pad nitride layer that exposes an isolation region over a cell region of a semiconductor substrate; forming a trench in the isolation region of the semiconductor substrate; forming an isolation layer within the trench; etching an active region of the semiconductor substrate by a certain depth to form a recessed isolation region; etching the isolation layer by a certain depth to form a recessed isolation region; depositing a gate metal layer in the recessed active region and the recessed isolation region to form a gate of a cell transistor; forming an insulation layer over an upper portion of the gate; removing the pad nitride layer to expose a region of the semiconductor substrate to be formed with a contact plug; and depositing a conductive layer in the region of the semiconductor substrate to form a contact plug.

6 Claims, 14 Drawing Sheets

SEMICONDUCTOR DEVICE HAVING SADDLE FIN TRANSISTOR AND METHOD FOR FABRICATING THE SAME

CROSS-REFERENCE TO RELATED APPLICATIONS

Priority to Korean patent application number 10-2008-0134817, filed on Dec. 26, 2008, the disclosure of which is incorporated by reference in its entirety, is claimed.

BACKGROUND OF THE INVENTION

1. Field of the Invention

The present invention relates generally to a semiconductor device and a method for fabricating the same, and more particularly, to a semiconductor device capable of preventing contact defect and overcoming a limit in a process margin by employing a damascene process and a saddle fin transistor structure, and a method for fabricating the same.

2. Brief Description of Related Technology

Recently, as a design rule of a semiconductor device is sharply reduced to sub-40 nm technology, an area of an active region in which the device can be formed is also reduced. Accordingly, various limitations in a process margin are present. Particularly, abnormal shape of a gate line, i.e., leaning of the gate line or roughness of the gate line, is a serious problem. Also, in a landing plug contact process, contact defects are present in a great level due to the influence of the abnormal shape of the gate line and limitation in space.

With employment of a recently developed saddle fin transistor, an off-current margin property of a cell transistor is improved and thus the limitation in device properties can be overcome to some level. The saddle fin transistor can ensure a stable refresh property in a recess gate structure and, at the same time, enhance a cell driving current property by forming a bottom face of the recess gate in a fin transistor structure to enlarge a channel width. In the saddle fin transistor, an isolation layer formed in the semiconductor substrate is etched to protrude an active region, so that both side faces and an upper face of the active region are exposed. A gate is then formed so as to cover the exposed portion of the active region. Consequently, a channel is formed in the exposed three faces of the active region, and the driving current property through the channel thus can be enhanced.

However, patterning for a linear type recess structure and increase in the leaning of the gate line and the roughness of the gate line cause an increase in the contact defect in a self aligned contact (SAC) process. Also, due to reduction in an area to be formed with a device together with such contact defect, it is actually impossible to ensure a margin of SAC process. Therefore, a novel process capable of overcoming the contact defect and the limitation in the process margin is necessary.

SUMMARY OF THE INVENTION

Disclosed herein is a semiconductor device capable of overcoming SAC defect and limitation in a process margin resulting from reduction in a design rule. The semiconductor device includes a landing plug contact formed without using a SAC process, and a method for fabricating the same.

In one embodiment, a semiconductor device includes a trench having a selected depth in an active region of a semiconductor substrate; an isolation layer surrounding the active region and having a recessed isolation region that forms a saddle type fin structure in the active region; a saddle fin gate of a cell transistor buried in the trench and the recessed isolation region; an insulation layer over saddle fin gate, the insulation layer exposing a region of the semiconductor substrate; and a contact plug in the region exposed by the insulation layer.

In another embodiment, a semiconductor device includes a semiconductor substrate having a cell region and a peripheral circuit region; a saddle fin gate disposed in the cell region under a surface of the semiconductor substrate; a stack type gate disposed over the peripheral circuit region of the semiconductor substrate; an insulation layer covering the saddle fin gate, the insulation layer exposing a contact region in the cell region; and a contact plug in the region exposed by the insulation layer in the cell region.

The saddle fin gate includes an inner wall of a trench having a certain depth in an active region of the cell region; a gate insulation layer along a surface of a recessed isolation region that forms a saddle fin structure; and a gate metal layer in the trench and the recessed isolation region.

In another embodiment, a method for fabricating a semiconductor device includes forming a pad nitride layer that exposes an isolation region over a cell region of a semiconductor substrate; forming a trench in the isolation region of the semiconductor substrate; forming an isolation layer within the trench; etching an active region of the semiconductor substrate by a selected depth to form a recessed active region; etching the isolation layer by a selected depth to form a recessed isolation region; depositing a gate metal layer in the recessed active region and the recessed isolation region to form a gate of a cell transistor; forming an insulation layer over an upper portion of the gate; removing the pad nitride layer to expose a region of the semiconductor substrate to be formed with a contact plug; and depositing a conductive layer in the region of the semiconductor substrate to form a contact plug.

In still another embodiment, a method for fabricating a semiconductor device includes forming a pad nitride layer that exposes an isolation region over a cell region and a peripheral circuit region; forming a trench isolation layer in the isolation region of the semiconductor substrate; recessing a portion of an active region to be formed with a channel by a selected depth; recessing a portion of the trench isolation layer to form the recessed active region in a saddle fin shape; forming a saddle fin gate buried under a surface of the semiconductor substrate in the recessed active region; forming an insulation layer over an upper portion of the saddle fin gate to isolate the saddle fin gate; removing the pad nitride layer to expose a portion of the semiconductor substrate in the cell region to be formed with a contact plug and the peripheral circuit region of the semiconductor substrate; forming a gate insulation layer over the peripheral circuit region of the semiconductor substrate; forming a conductive layer over the cell region; forming a conductive layer over the peripheral circuit region of the semiconductor substrate; and etching the conductive layers to form a contact plug in the cell region and a stack type gate in the peripheral circuit region.

Figure 1:
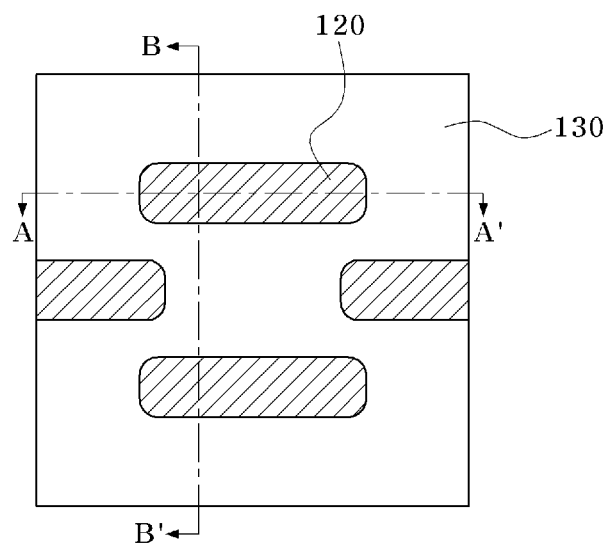
FIGS. 1 through 14B are plan and cross-sectional views illustrating a method for forming a semiconductor device having a saddle fin transistor in accordance with an embodiment.

While the disclosed method is susceptible of embodiments in various forms, specific embodiments are illustrated in the drawings (and will hereafter be described), with the understanding that the disclosure is intended to be illustrative, and is not intended to limit the invention to the specific embodiments described herein.

DESCRIPTION OF SPECIFIC EMBODIMENTS

Disclosed herein is a method capable of preventing a contact defect and ensuring a process margin by forming a contact plug with a cell transistor of a saddle fin structure and a non-SAC using a damascene process.

FIGS. 1 through 14B are cross-sectional views illustrating a method for forming a semiconductor device having a saddle fin transistor in accordance with an embodiment and resulting intermediate and final structures. FIGS. 1, 3, 4, 5, 7, 9 and 11 are plan views, FIGS. 2A, 4A, 6A, 8A, 10A, 12A and 14A are cross-sectional views taken along a line A-A' in the plan views, respectively, and FIGS. 2B, 4B, 6B, 8B, 10B, 12B and 14B are cross-sectional views taken along a line B-B' in the plan views, respectively.

Figure 14A:
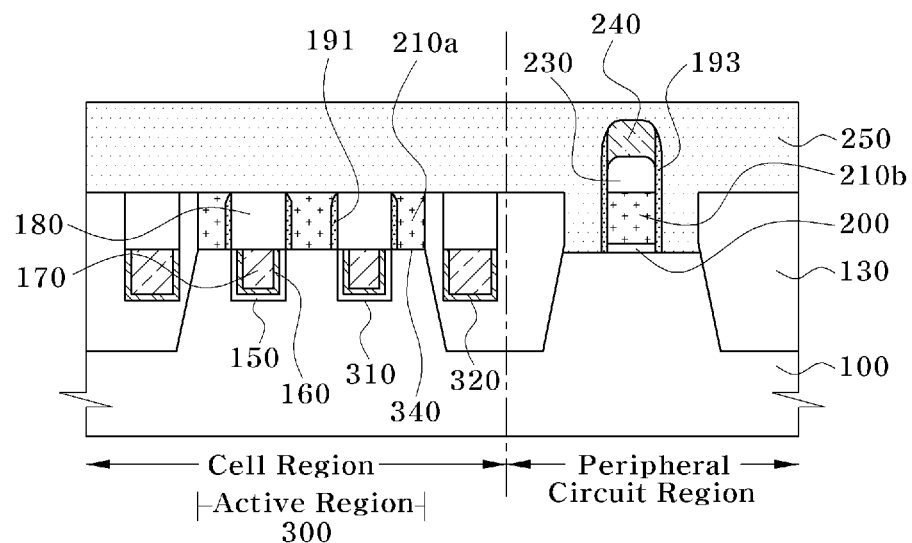
Figure 14B:
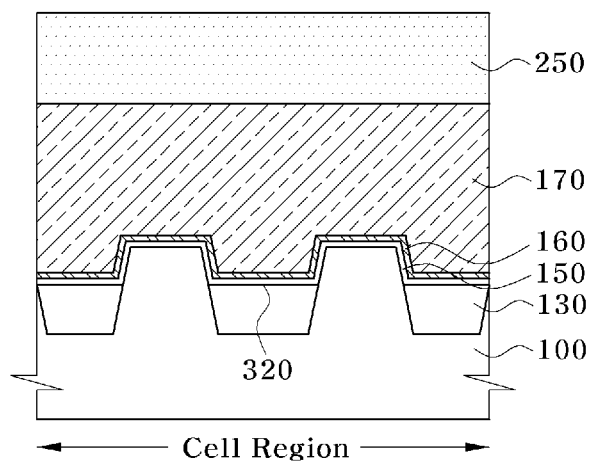

A structure of a semiconductor device having a saddle fin transistor will be described first. FIGS. 14A and 14B are cross-sectional views in a direction of a bit line and a direction of a word line, respectively, illustrating a semiconductor device having a saddle fin transistor in accordance with an embodiment.

Figure 13:
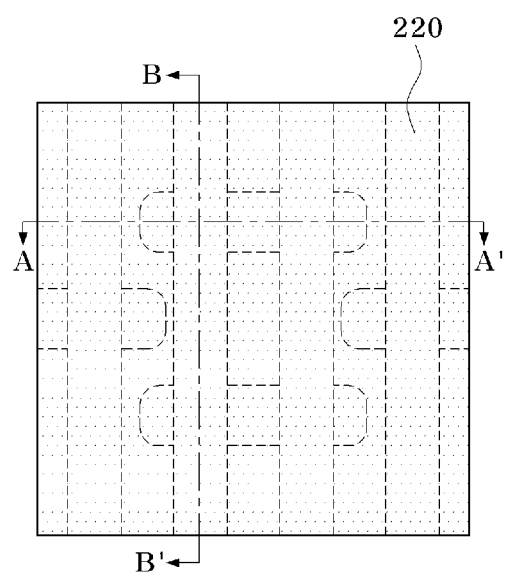

Referring to FIGS. 13, 14A, and 14B, a semiconductor device includes a semiconductor substrate 100 having a cell region and a peripheral circuit region. The device further includes a trench 310 formed to a selected depth in an active region 300 of the cell region and an isolation layer 130 surrounding the active region 300 and having a recessed isolation region 320 that forms a saddle fin structure. The device includes a saddle fin gate of a cell transistor in the trench 310 and the recessed isolation region 320. In the peripheral region of the semiconductor substrate is a stack type gate. The device further includes an insulation layer 180 over the saddle fin gate, the insulation layer 180 exposing a contact region of the cell region, and a contact plug 210a formed between the insulation layer 180.

The saddle fin gate disposed in the cell region includes a gate insulation layer 150 formed on a surface of the trench 310, a polysilicon layer 160 over the gate insulation layer 150, and a gate metal layer 170 buried within the trench. If necessary, the polysilicon layer 160 can be omitted.

The stack type gate includes a gate insulation layer 200, a gate conductive layer 210b, a metal electrode 230, and a hard mask 240, which are sequentially stacked over the peripheral circuit region of the semiconductor substrate.

The contact plug 210a and the gate conductive layer 210b of the stack type gate formed in the peripheral circuit region can be formed of the same material, for example, a polysilicon layer or a metal layer. In addition, a nitride layer spacer 191 can be provided on a side face of the insulation layer 180 and a spacer 193 can be provided on a side face of the stack type gate formed in the peripheral circuit region. An interlayer insulation layer 250 can be formed over the resulting structure.

Next, a method for fabricating a semiconductor device having a saddle fin transistor in accordance with an embodiment will be described.

Figure 2A:
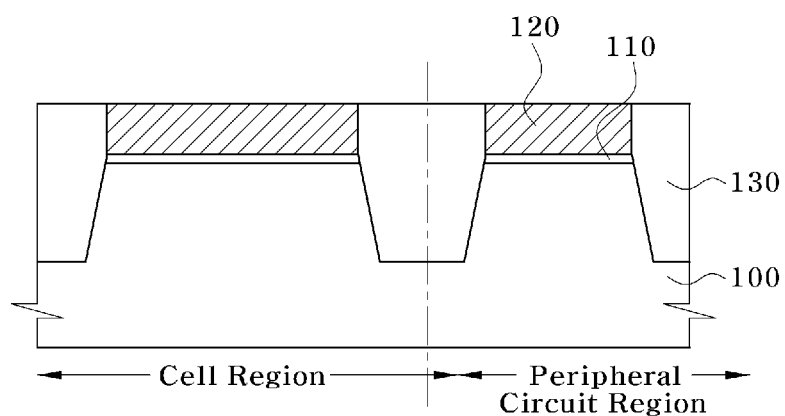
Figure 2B:
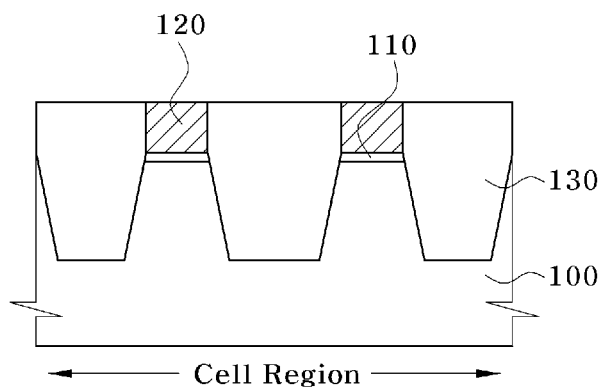

Referring to FIGS. 1, 2A and 2B, a pad oxide layer 110 and a pad nitride layer 120 are sequentially formed over a semiconductor substrate 100, such as, for example, a silicon (Si) substrate. The pad oxide layer 110 functions to relieve stress applied to the semiconductor substrate 100 by attraction of the pad nitride layer 120, and is preferably formed to a thickness in a range of 50 to 150 Å. The pad nitride layer 120 functions as a hard mask in a subsequent etch process for forming an isolation trench 330, and is preferably formed to a thickness in a range of 800 to 1,500 Å.

Next, a photoresist pattern (not shown) for delimiting an isolation region over the pad nitride layer 120 is formed and the pad nitride layer 120 and the pad oxide layer 110 are then anisotropically etched using the photoresist pattern as a mask to expose the isolation region of the semiconductor substrate. The photoresist pattern is removed and the exposed region of the semiconductor substrate is then preferably anisotropically etched to a thickness in a range of 2,000 to 3,500 Å to form an isolation trench 330 for forming an isolation layer.

Next, an insulation layer, e.g., a high density plasma (HDP) oxide layer or a spin on dielectric (SOD), is deposited over an entire face of the semiconductor substrate to bury the isolation trench 330. A planarization process, such as, for example, etch back or chemical mechanical polishing (CMP), is performed on the deposited insulation layer to form an isolation layer 130 in the isolation trench 330. The insulation layer can be deposited as a multi-layer of two or more layers. Also, the etch back or CMP process on the insulation layer can be performed until the pad nitride layer 120 is exposed using the pad nitride layer 120 as an etch stop layer. Though not shown, before the insulation layer is deposited, an inner wall oxide layer or a liner nitride layer can be formed on an inner wall of the isolation trench 330. The active region is delimited by the isolation layer 130.

Figure 3:
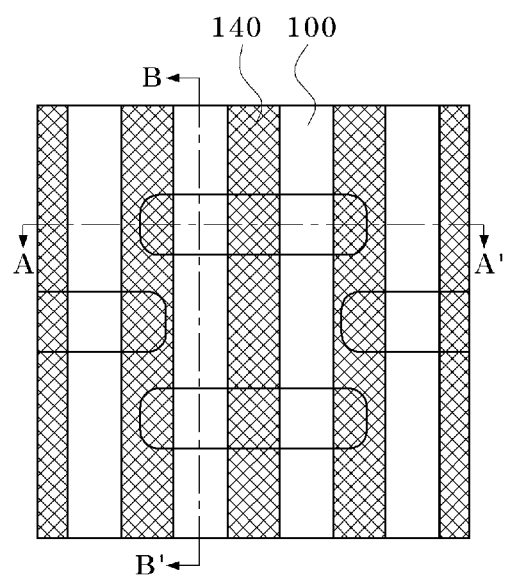
Figure 4A:
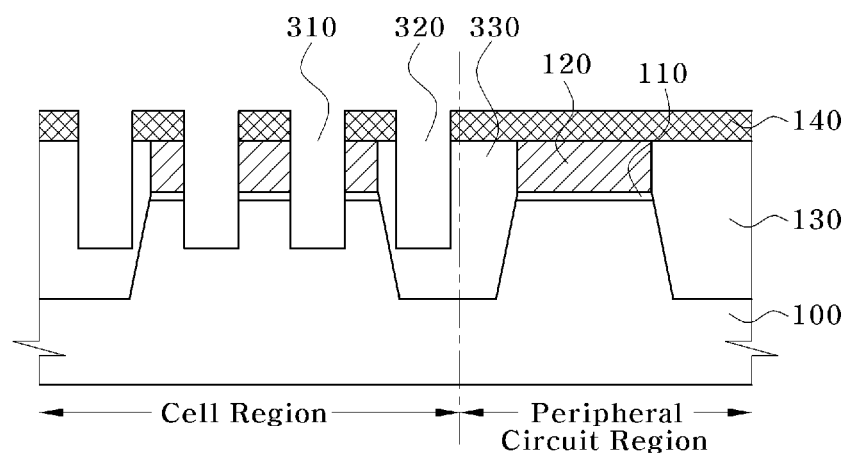
Figure 4B:
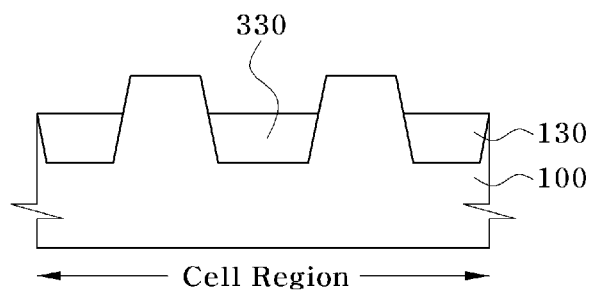

Referring to FIGS. 3, 4A and 4B, an amorphous carbon layer, for example, is preferably formed to a thickness in a range of 1,500 to 2,500 Å over the resulting product of the semiconductor substrate formed with the isolation layer 130 in FIGS. 1, 2A, and 2B. The region of the amorphous carbon layer to be formed with a channel of a cell transistor is etched to form a hard mask 140, which exposes the region to be formed with the channel of the cell transistor. The pad nitride layer 120 and the pad oxide layer 110 in the cell region are etched using the hard mask 140 as a mask to expose the region of the semiconductor substrate to be formed with the channel, and the exposed portion of the semiconductor substrate is then etched to a certain depth to form a channel trench 310. The channel trench is formed in a region of the cell region to be formed with the channel 310 of a cell transistor.

Subsequently, the portion of the isolation layer 130 adjacent to the channel trench 310 is recessed to form a recessed isolation region 320, which forms a saddle type fin. In other words, the portion of the isolation layer 130 in contact with both ends of the isolation trench 330 is etched to a certain depth to form the fin shape as shown.

The depth to which the isolation layer 130 is recessed is preferably in a range of 1,500 to 2,000 Å to ensure a surface resistance (Rs) required in a device. Also, the etch using the hard mask 140 and the etch on the semiconductor substrate 100 and the isolation layer 130 for forming the saddle fin structure can be performed in situ.

Figure 5:
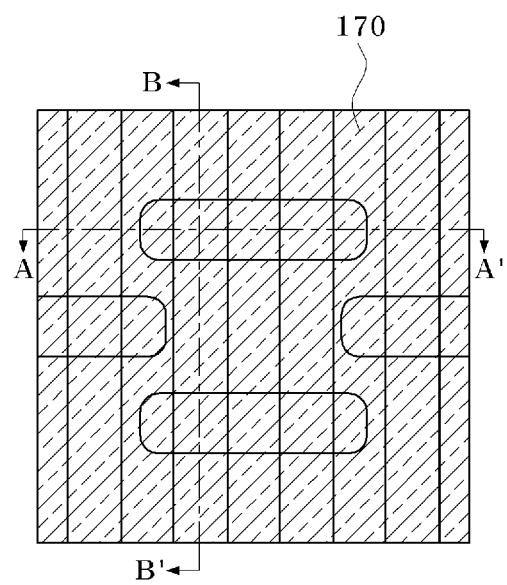
Figure 6A:
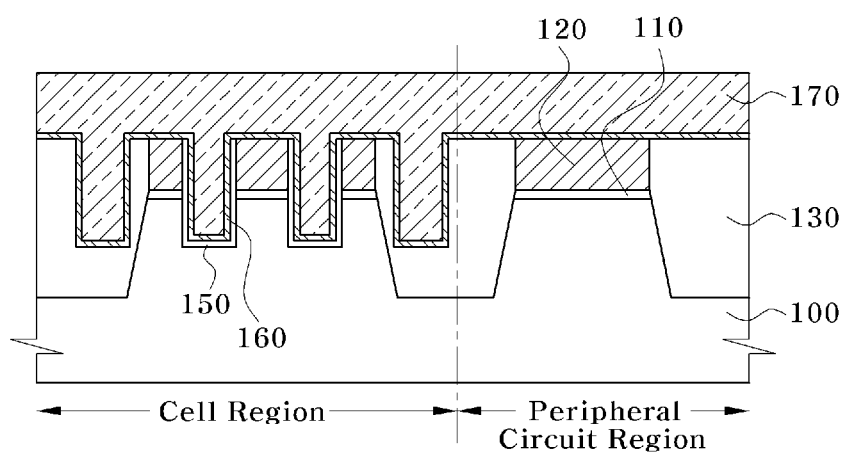
Figure 6B:
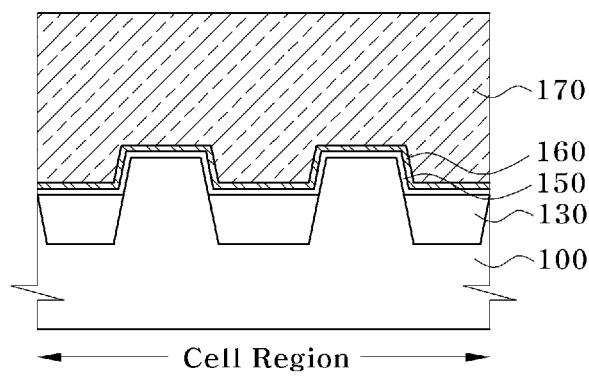

Referring to FIGS. 5, 6A and 6B, a gate insulation layer 150 is formed over surfaces of the channel trench and the saddle fin. The hard mask (140 in FIG. 4A) is optionally removed. The gate insulation layer is preferably formed of an oxide layer with a preferred thickness in a range of 50 to 70 Å. A polysilicon layer 160 with a preferred thickness in a range of 30 to 60 Å is formed over the gate insulation layer 150. The polysilicon layer can be formed over the entire structure. Next, a gate metal layer 170 is deposited over the polysilicon layer 160 and is preferably formed of a hybrid tungsten (W) or tungsten silicide (WSi) with a preferred thickness in a range of 300 to 500 Å. The gate metal layer 170 is, as shown, formed to fill the channel trench 310 and resulting structure and over the recessed isolation region 320. If necessary, the polysilicon layer 160 can be omitted and the gate metal layer 170 can be directly formed over the gate insulation layer 150.

Figure 7:
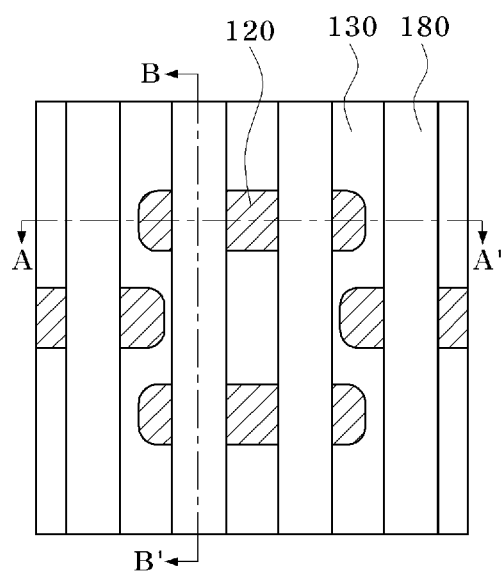
Figure 8A:
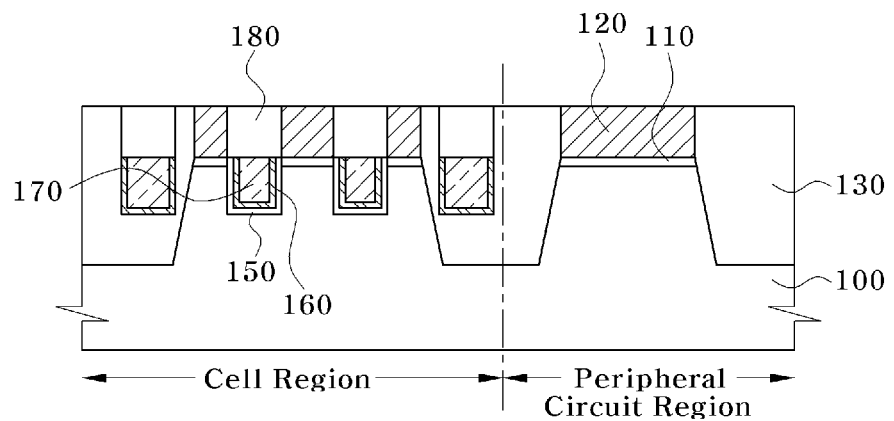
Figure 8B:
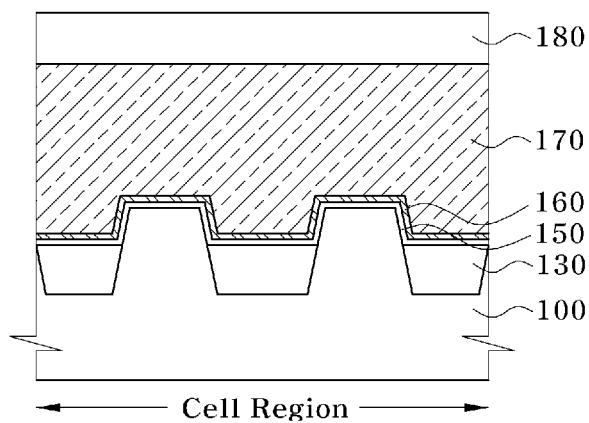

Referring to FIGS. 7, 8A and 8B, an etch back or a CMP followed by an etch back is performed to reduce the gate metal layer 170 to a height of the surface 340 of the active region 300. Therefore, the gate metal layer 170 remains only in the channel trench 310 and the recessed isolation region 320 in the cell region. Meanwhile, the etch back can be performed so that the upper surface of the gate metal layer 170 can be lower than that of the surface 340 of the active region 300.

Next, to isolate the gate metal layer 170 from the other conductive layers, an insulation layer 180, for example, such as a HDP oxide layer or boron phosphorus silicate glass (BPSG), is formed to a certain thickness over the entire face of the resulting product. An etch back or CMP process is performed on the insulation layer 180 to expose the pad nitride layer 120 so that the gate metal layer 170 is buried and isolated from the other conductive layers. Therefore, a gate, which is buried within the trench in a direction of a major axis (B-B') and forms a saddle fin structure in a direction of a minor axis (A-A'), is formed in the cell region.

Figure 9:
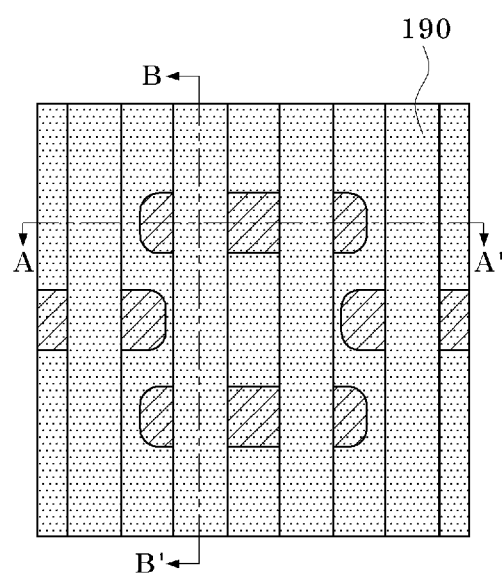
Figure 10A:
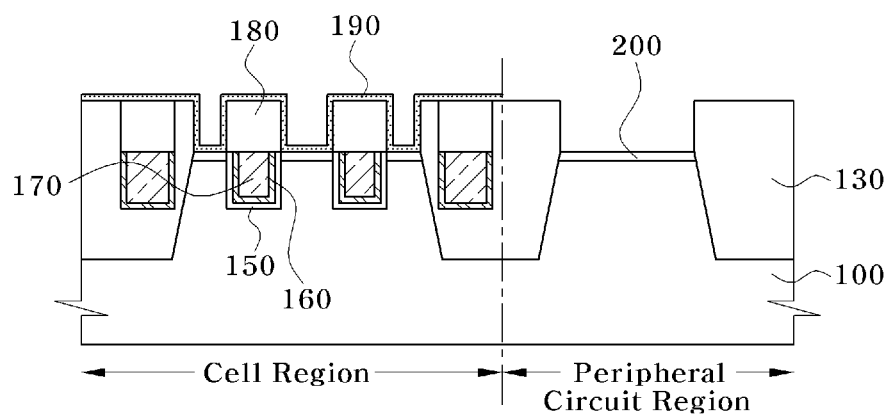
Figure 10B:
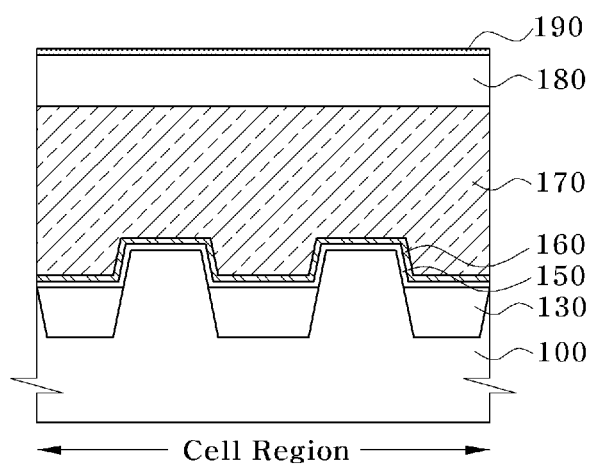

Referring to FIGS. 9, 10A and 10B, all the remaining pad nitride layer 120 in the cell region and the peripheral circuit region is removed, for example, using a phosphoric acid solution. Next, to prevent the cell region from being oxidated when subsequently forming the gate oxide layer in the peripheral circuit region, a buffer nitride layer 190 with a preferred thickness in a range of 30 to 50 Å is formed over the resulting product. The buffer nitride layer and the pad oxide layer 110 in the peripheral circuit region are removed and an oxide layer with a preferred thickness in a range of 20 to 50 Å is then formed over the resulting product to form a gate insulation layer 200 in the peripheral circuit region. At this time, an additional process can be performed in a case of forming a dual gate structure.

Figure 11:
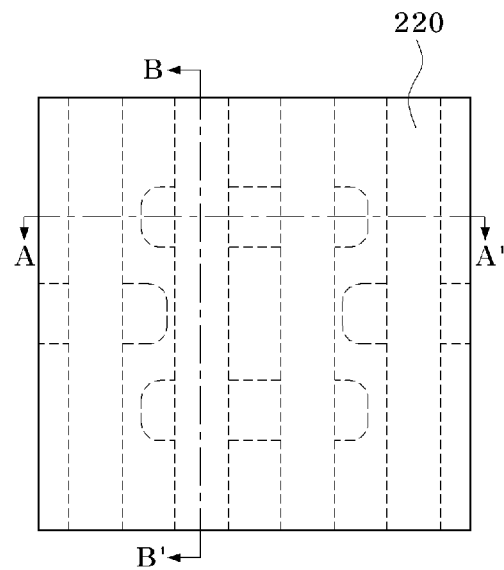
Figure 12A:
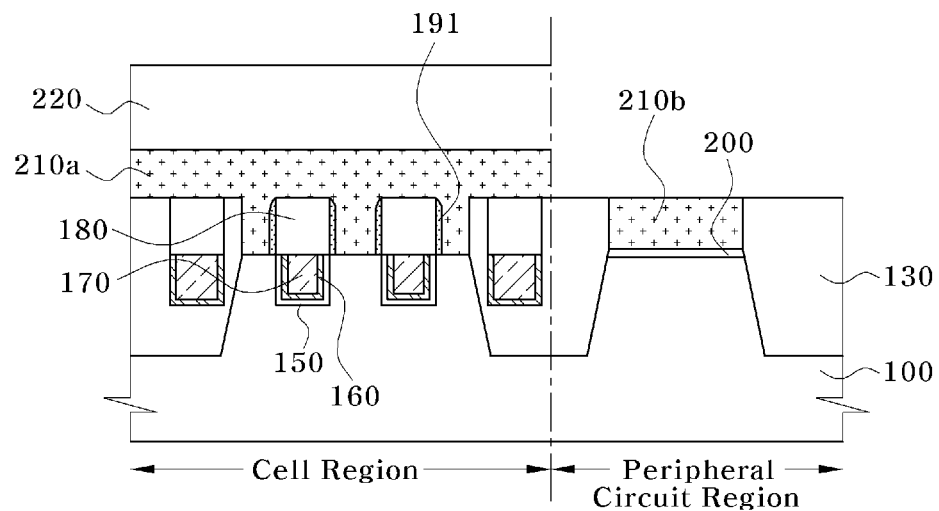
Figure 12B:
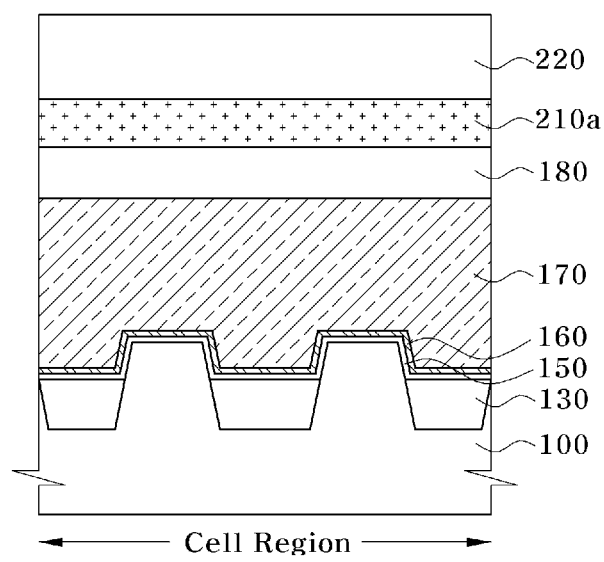

Referring to FIGS. 11, 12A and 12B, the buffer nitride layer 190 and the pad oxide layer 110 that remains in the cell region are etched to expose the region of the semiconductor substrate to be formed with the contact plug. The buffer nitride layer 190 in the cell region can be left, as shown, on the side wall of the insulation layer 180 to form a spacer 191. A contact plug 210a in the cell region and a gate conductive layer 210b in the peripheral circuit region are preferably formed by depositing a doped polysilicon layer or metal layer with a preferred thickness in a range of 2000 to 3000 Å over the resulting structure. The gate conductive layer 210b formed in the peripheral circuit region is used as a gate electrode.

Next, a photoresist pattern 220 that exposes the peripheral circuit region is formed to ensure a certain thickness of the polysilicon layer required in the peripheral circuit region, and the gate conductive layer 210b in the peripheral circuit region is etched by a predetermined thickness using the photoresist pattern as a mask to leave the gate conductive layer 210b with a preferred thickness in a range of 500 to 800 Å.

Referring to FIGS. 13, 14A and 14B, the photoresist pattern (220 in FIG. 6A) is removed and a metal electrode layer and a hard mask layer are then sequentially formed over an entire face of the resulting product. The metal electrode layer is preferably formed of a tungsten (W) or tungsten silicide (WSi) layer and is preferably formed to a thickness in a range of 300 to 500 Å. The hard mask layer is preferably formed of a nitride layer and is preferably formed to a thickness in a range of 2,000 to 3,000 Å. The metal electrode layer prefer-ably reduces resistance of a gate formed in the peripheral circuit region. The hard mask patterns the gate formed in the peripheral circuit region.

A photoresist pattern (not shown) that delimits a region to be formed with the gate in the peripheral circuit region is formed, and the hard mask layer, the metal electrode layer, and the gate conductive layer 210b are then etched using the photoresist pattern as a mask to form a gate stack including a metal electrode 230 and a hard mask 240 in the peripheral circuit region. The etch preferably is also performed in the cell region, and the hard mask layer and the metal electrode layer in the cell region are entirely removed and the doped polysilicon (or metal) layer is etched until the insulation layer 180 is exposed, thereby accomplishing isolation between the contact plugs 210a.

Next, an interlayer insulation layer 250 is deposited over the resulting product formed with the gate in the peripheral circuit region. The interlayer insulation layer 250 is preferably formed of an oxide layer with a preferred thickness of 3,000 to 5,000 Å. After that, processes of forming a storage node contact and a capacitor are performed according to a conventional manner.

The disclosed semiconductor substrate and a method for fabricating the same preferably have one or more advantages. For example, it is possible to fundamentally prevent defects resulting in the SAC process since there is no need for a photolithography process for forming a landing plug by forming a cell transistor of a saddle fin structure and a non-SAC process using a damascene process. It is also possible to largely improve turn around time required to produce a product by reducing a number of processes. In addition, by employing a buried word line and a saddle fin structure, it is possible to ensure superior device properties. It is possible to enhance operation speed of a device with reduction of a parasitic capacitance of the word line and the bit line.

While the present invention has been described with respect to the specific embodiments, it will be apparent to those skilled in the art that various changes and modifications may be made without departing from the spirit and scope of the invention as defined in the following claims.

What is claimed is:

1. A semiconductor device having a saddle fin transistor, comprising:
   a semiconductor substrate having
      a cell region and
      a peripheral circuit region;
   a trench isolation region defining
      an active region of the cell region and
      the peripheral circuit region;
   a saddle fin gate disposed in the cell region,
   wherein the saddle fin gate is
      formed in a recess in which the active region is formed and protrudes from the isolation region in a gate forming region;
   a stack type gate disposed over the peripheral circuit region of the semiconductor substrate;
   an insulation layer covering the saddle fin gate,
   the insulation layer exposing a contact region in the cell region; and
   a contact plug in the contact region exposed by the insulation layer in the cell region;
   wherein
      the contact plug is adjacent to the saddle fin gate and
      the contact plug and the stack type gate comprise the same conductive layer.

2. The semiconductor device having a saddle fin transistor of claim 1, wherein the saddle fin gate comprises an inner wall of a trench having a selected depth in an active region of the cell region;

a gate insulation layer along a surface of a recessed isolation region that forms a saddle fin structure; and a gate metal layer in the trench and the recessed isolation region.

3. The semiconductor device having a saddle fin transistor of claim 2, wherein the saddle fin gate further comprises a doped polysilicon layer between the gate insulation layer and the gate metal layer.

4. The semiconductor device having a saddle fin transistor of claim 1, wherein the stack type gate comprises a gate insulation layer, a gate conductive layer, a metal electrode layer and a hard mask, which are sequentially stacked over the peripheral circuit region of the semiconductor substrate.

5. The semiconductor device having a saddle fin transistor of claim 1, wherein the contact plug comprises the same material as a gate conductive layer of the stack type gate in the peripheral circuit region.

6. The semiconductor device having a saddle fin transistor of claim 1, further comprising a nitride layer spacer on a side face of the insulation layer.

* * * * *